(12) United States Patent
Deppe

(10) Patent No.: US 7,046,049 B2
(45) Date of Patent: May 16, 2006

(54) DRIVER CIRCUIT FOR CONTROLLING A RESONANT CONVERTER

(75) Inventor: Carsten Deppe, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 11 days.

(21) Appl. No.: 10/501,292

(22) PCT Filed: Jan. 9, 2003

(86) PCT No.: PCT/IB03/00029

§ 371 (c)(1),
(2), (4) Date: Jul. 12, 2004

(87) PCT Pub. No.: WO03/058804

PCT Pub. Date: Jul. 17, 2003

(65) Prior Publication Data

US 2005/0116748 A1 Jun. 2, 2005

(30) Foreign Application Priority Data

Jan. 12, 2002 (DE) ................................ 102 00 917

(51) Int. Cl.
*H03B 1/00* (2006.01)
(52) U.S. Cl. ..................................................... 327/108
(58) Field of Classification Search ................ 327/108, 327/112; 326/82–85, 87
See application file for complete search history.

(56) References Cited

U.S. PATENT DOCUMENTS

| | | | | |
|---|---|---|---|---|
| 5,105,099 A | * | 4/1992 | Routh et al. ................. | 327/384 |
| 5,408,150 A | * | 4/1995 | Wilcox ......................... | 327/108 |
| 5,543,740 A | | 8/1996 | Wong ............................ | 327/108 |
| 6,201,429 B1 | * | 3/2001 | Rosenthal .................... | 327/333 |
| 6,307,409 B1 | * | 10/2001 | Wrathall ..................... | 327/112 |
| 6,353,345 B1 | * | 3/2002 | Yushan et al. .............. | 327/112 |
| 6,774,674 B1 | * | 8/2004 | Okamoto et al. ............. | 326/80 |

* cited by examiner

*Primary Examiner*—My-Trang Nu Ton
(74) *Attorney, Agent, or Firm*—Kevin Fortin

(57) ABSTRACT

In order to improve the efficiency of a driver circuit for controlling upper and lower switching means (T3, T4) for converting a direct voltage Ud into a clocked output voltage Ua for a resonant converter with a high-voltage section (HT) for controlling the upper switching means (T3) and a low-voltage section (NT) for controlling the lower switching means (T4), which switch the switching means (T3, T4) on alternately to one another, the switch-on phases of the switching means (T3, T4) being separated from one another by dead-time phases, there is provided a first circuit section which controls the duty cycle Δtein3 of the upper switching means (T3) as a function of the duty cycle Δtein4 of the lower switching means (T4), and receives control signals from the low-voltage section (NT) exclusively during the duty cycle Δtein4 of the lower switching means (T4).

12 Claims, 3 Drawing Sheets

DRIVER CIRCUIT FOR CONTROLLING A RESONANT CONVERTER

The invention relates to a driver circuit for controlling upper and lower switching means for converting a direct voltage Ud into a clocked output voltage Ua for a resonant converter with a high-voltage section for controlling the upper switching means and a low-voltage section for controlling the lower switching means, which switch the switching means on alternately, the switch-on phases of the switching means being separated from one another by dead-time phases.

Converters with resonant-circuit elements, known as resonant converters, serve for supplying a load connected at the output with a direct voltage or with a direct current, or with an alternating voltage or an alternating current. They have diverse applications, and are used, in particular, for operating gas discharge lamps, monitors, audio appliances or in vehicle technology. Resonant converters may be designed as DC/DC converters or as DC/AC converters.

In resonant converters of the type cited above, a direct voltage Ud is converted, by means of a bridge circuit or half-bridge circuit comprising switches, into a clocked alternating voltage Ua, which alternates between a high voltage Ud and a zero voltage. The clocked alternating voltage is fed to a circuit with at least one inductive and one capacitive resonant-circuit element, i.e. with inductive and capacitive reactance components, in such a way that an approximately sinusoidal alternating current flows in the circuit in the case of operation above the resonant frequency. This alternating current is then rectified and smoothed on the output side, and used as a supply voltage for a load connected to the converter. Adaptation to load changes and input-voltage fluctuations can be performed by adapting the switching frequency for the switches.

In resonant converters, the aim is for so-called zero voltage switching (ZVS) in order to reduce the switching complexity and to avoid switching losses, transistors, in particular MOSFETs, are generally being used as switches. ZVS here and below means the switching on of the switches (transition into the conductive state) with the smallest possible switching voltage, preferably in the proximity of zero volts. To enable ZVS, dead-time phases in which all switches of the converter are switched off, i.e. in the non-conductive state, have to be provided. To this end, before the part of the bridge circuit or half-bridge circuit carrying the high voltage Ud is switched on, the output voltage Ua has to be increased to Ud and, analogously, the output voltage Ua has to be reduced to zero volts before the part of the bridge circuit or half-bridge circuit carrying zero potential is switched on. This is achieved by suitably proportioning the inductance of the resonant converter in association with the converter current and the capacitances of the transistors as well as any capacitors in parallel configuration.

A signal having the potential of the switch is required for driving the upper switch in the half-bridge (or both upper switches in a full bridge), which signal must precisely match the signals of the lower switch in terms of time. The potential of this switch fluctuates jointly with Ua between the zero potential and Ud. There are two loss-free methods for converting potentials, which, however, both introduce considerable disadvantages. One option is to use transformers with galvanic isolation. This solution is costly, the switching complexity for a rapid switch-off to minimize switching losses necessitating considerable outlay. The other option is to use rapid optocouplers, which, however, are just as costly, and necessitate the use of additional driver circuits.

The fully-integrated method normally used today is the transfer of the switch-on and switch-off information, by means of short pulses of a clock generator, to a high side logic circuit supplied via a bootstrap capacitor and sliding with the transistor potential. Owing to the high voltage differences, considerable power consumption takes place despite small currents and short pulses. Since this power arises in the chip and has to be dissipated as heat, the frequency range is restricted and the efficiency factor of the resonant converter is reduced. This is a disadvantage especially in low-load operation of resonant power packs if the power pack only has to supply low power, since the frequency, and hence the power required for level shift and activation, increases as a result of the control.

It is therefore an object of the invention to provide a driver circuit of the type cited above with a better efficiency.

This object is achieved in a driver circuit of the type cited above by a first circuit section which controls the duty cycle $\Delta tein3$ of the upper switching means (T3) as a function of the duty cycle $\Delta tein4$ of the lower switching means (T4), and receives control signals from the low-voltage section (NT) exclusively during the duty cycle $\Delta tein4$ of the lower switching means (T4).

The basic idea of the invention consists in the fact that the signals for switching the upper switching means on and off are generated without any necessity for transmitting a clock signal.

Whereas in driver circuits known from prior art the power consumption increases in proportion to the increase in the switching frequency, the power consumption in the driver circuit according to the invention remains constant at a very low level. The high-voltage section of the driver circuit thus no longer exerts a restricting effect on the clock frequency at which the driver circuit can be operated, since the heat dissipation in the driver circuit is significantly reduced owing to the low power consumption. As a result, the efficiency of the driver circuit can be increased many times over. This applies particularly to low-load and standby operation.

One further considerable advantage consists in the fact that, owing to the reduced dissipation heat, a higher integration capability exists for ICs in which a driver circuit of this kind is realized and, in particular, a fully-integrated subminiature power pack is possible. Control takes place simply by specifying the frequency; the pulse duty factor and the dead-time phases are adjusted automatically.

In a simple, favorable embodiment of the driver circuit according to the invention, the first circuit section is equipped with at least one first integrating circuit configuration, which is charged during the duty cycle $\Delta tein4$ of the lower switching means, and discharged during the duty cycle $\Delta tein3$ of the upper switching means. This first integrating circuit configuration can, in particular, be equipped with at least one integration capacitor and a charging circuit and a discharging circuit, the charging circuit and the discharging circuit preferably being equipped with a respective constant-current source.

By charging the integration capacitor with a constant-current source, a precise measure of the duration for which the lower switching means have been switched on is obtained and can be called up by discharging the integration capacitor via a constant-current source, the current I of which corresponds to the current during the charging of the capacitor. However, other embodiments suitable for determining a measure of a duration, such as integration amplifiers, are also conceivable.

The information as to the duration within which the lower switching means are switched on preferably appears via a transistor in the low-voltage section which transmits a signal to the high-voltage section (HT) for the duration of switch-on of the lower switching means (T4). The sole signal transmitted from the low-voltage section to the high-voltage section can thus be transmitted at an instant at which the output voltage Ua is equivalent to zero. As a result, the power required for the information transmission is minimal (e.g. 1 mA at 15 V and 40% duty cycle=6 mW). Since the transistor is in principle in the blocked state when a higher voltage is present at Ua, this power is also independent of Ud.

To determine the switch-on instant of the upper switching means, a second circuit section can be provided, which determines the switch-on instant tein3 of the upper switching means as a function of the voltage characteristic of the output voltage Ua. To this end, it may, for example, be equipped with a second voltage-increase recognition circuit with at least one capacitor, one resistor and one comparator, especially a Schmitt trigger.

This voltage-increase recognition circuit determines, a value for the voltage gradient dU/dt of the output voltage Ua during the dead-time phase before the switch-on of the first switching means, during which the voltage increases from zero to Ud, the voltage-increase recognition circuit supplying a signal to switch on the upper switching means as soon as the voltage increase of Ua is completed.

The switch-on instant of the upper switching means may, for example, also be determined via the instant at which the voltage increase from Ua to the value of Ud is completed. This may be achieved in that the voltage present at Ua is measured and compared with the value of Ud with the aid of a comparator, the comparator emitting, on reaching the value of Ud, a logic signal for switching on the upper switching means.

Alternatively, a second voltage section may be provided with means which control the duration Δttot1 of the first dead-time phase before the switch-on of the upper switching means (T3) as a function of the duration Δttot2 of the second dead-time phase before the switch-on of the lower switching means (T4). In this case, the control of the switch-on instant depends on the characteristic of the output voltage to the extent that the dead-time phase before the switch-on of the lower switching means is determined by the time lapse that is necessary in order that the output voltage Ua can decrease from Ud to the value zero following switch-off of the upper switching means. The second circuit section may also be equipped with means that control the duration Δttot1 of the first dead-time phase before the switch-on of the upper switching means (T3) by an external timer.

To this end, the second circuit section may be equipped with at least a second integrating circuit configuration which is charged for the duration Δttot2 of the second dead-time phase or for the duration of a signal from a timer connected to the low-voltage section, which signal is transmitted to the high-voltage section within the switch-on phase of the lower switching means, and discharged for the duration Δttot1 of the first dead-time phase. The structure of this second integrating circuit configuration may advantageously correspond to the structure of the first integrating circuit configuration.

Furthermore, the end of the dead-time phase before switch-on of the lower switching means, and hence the instant of switch-on of the lower switching means, may be determined by a voltage-decrease recognition circuit with at least one capacitor, one resistor and one comparator, especially a Schmitt trigger, with which, as with the voltage-increase recognition circuit, the voltage gradient dU/dt of the output voltage Ua is evaluated whilst it decreases from Ud to zero.

As a result, it is possible not just to switch the upper switching means of the high-voltage section of the driver circuit completely independently of the clock signal of a clock generator, but also to design the low-voltage section in such a way that only one signal edge of the clock signal is required for determining the duty cycle of the lower switching means, thus adapting the power fed to the resonant converter to the load thereof.

With the use of integrating circuit configurations, the charging and discharging cycles for determining the duration of switch-on times or dead-phases can, in principle, be reversed, so that, for example, an integration capacitor for determining the duty cycle of the upper switching means is discharged from a charged state during the duty cycle of the lower switching means, and, subsequently, the upper switching means remain switched on until the integration capacitor is again fully charged. For this reversal of the operating principle, only slight modifications to the circuit logic are necessary and, to this extent, as an obvious alternative having the same effect, it is regarded as falling within the scope of the claims.

The driver circuit according to the invention, enables a reduction of the power required for potential reversal at Ua by a factor of 10 to 100, the manufacturing costs of a circuit of this kind being essentially the same as for already-known integrated driver circuits.

The invention will be described in detail with reference to embodiments shown in the drawings, to which, however, the invention is not restricted.

Figure 1:
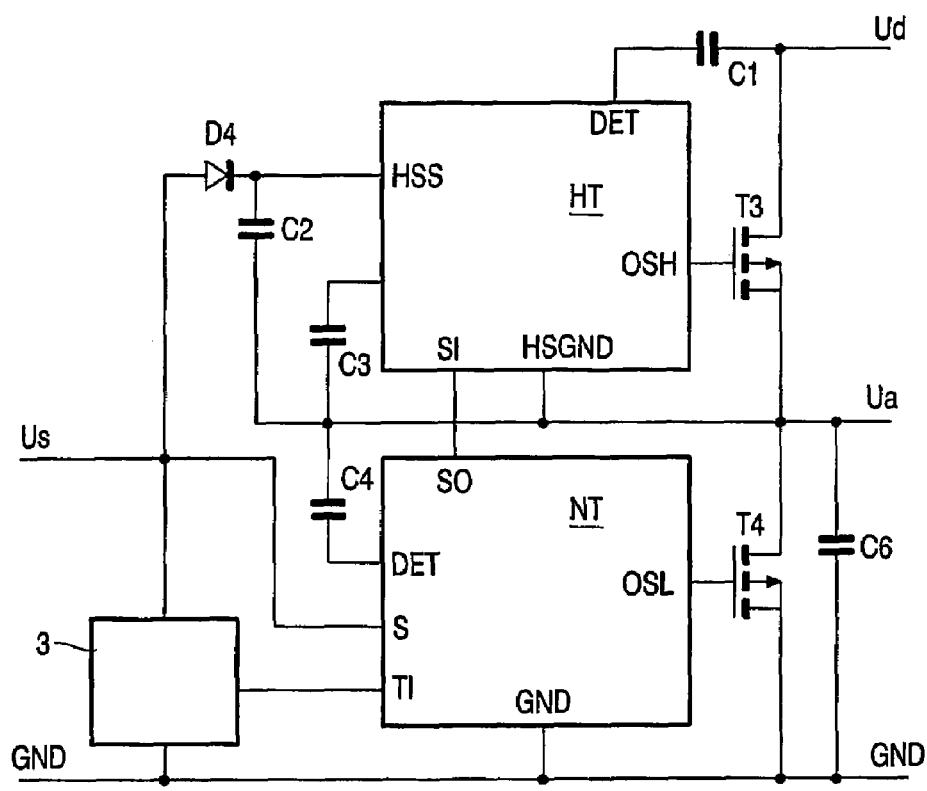
FIG. 1 shows a block diagram of a preferred driver circuit.

The block diagram of in FIG. 1 shows a driver circuit for a resonant converter. It is equipped with a half-bridge circuit with an upper MOSFET T3 and a lower MOSFET T4, which are series-connected, at the upper MOSFET T3 the input direct voltage Ud is present, and at the lower MOSFET T4 a low potential is present, the output voltage Ua being tapped off via the ground potential, between the series-connected MOSFETs T3, T4. A capacitor C6 may be provided parallel to the lower MOSFET to set dUa/dtmax.

The driver circuit comprises a high-voltage section HT for controlling the switch-on times of the MOSFET T3, and a low-voltage section NT for controlling the switch-on times of the MOSFET T4, the switch-on times of the MOSFETs T3, T4 following one another alternately and being separated from one another by dead-time phases Ttot.

The low-voltage section NT is equipped with an input Supply (S for short) for the supply voltage Us and an input GND at ground potential. It is also equipped with a signal input dU/dt detect (DET for short), which is connected to the potential Ua of the output of the half-bridge circuit via a capacitor C4. The low-voltage section NT is connected to the gate electrode of the MOSFET T4 via the output Out Side Low (OSL for short). In addition, the low-voltage section NT is coupled to the high-voltage section 2 via the output Signal Out (SO for short). Finally, the low-voltage section NT is equipped with a clock input Takt In (TI for short) which carries the clock signal of a clock generator 3.

The high-voltage section HT is equipped with an input High Side Supply (HSS for short) for the supply voltage Us and an output High Side GND (HSGND for short), which is connected to the output Ua of the half-bridge circuit. The input HSS is fed via a bootstrap circuit C2, D4, the input being connected to the supply voltage Us via a diode D4, and via a capacitor C2 to HSGND of the half-bridge circuit, which carries the potential Ua. Furthermore, it is equipped with a signal input dU/dt detect (DET for short), which is connected to the potential Ud of the output of the half-bridge circuit via a capacitor C1. The high-voltage section HT is connected to the gate electrode of the MOSFET T3 via the output Out Side High (OSH for short). In addition, the high-voltage section HT is coupled to the high-voltage section HT via the output Signal In (SI for short).

Figure 2:
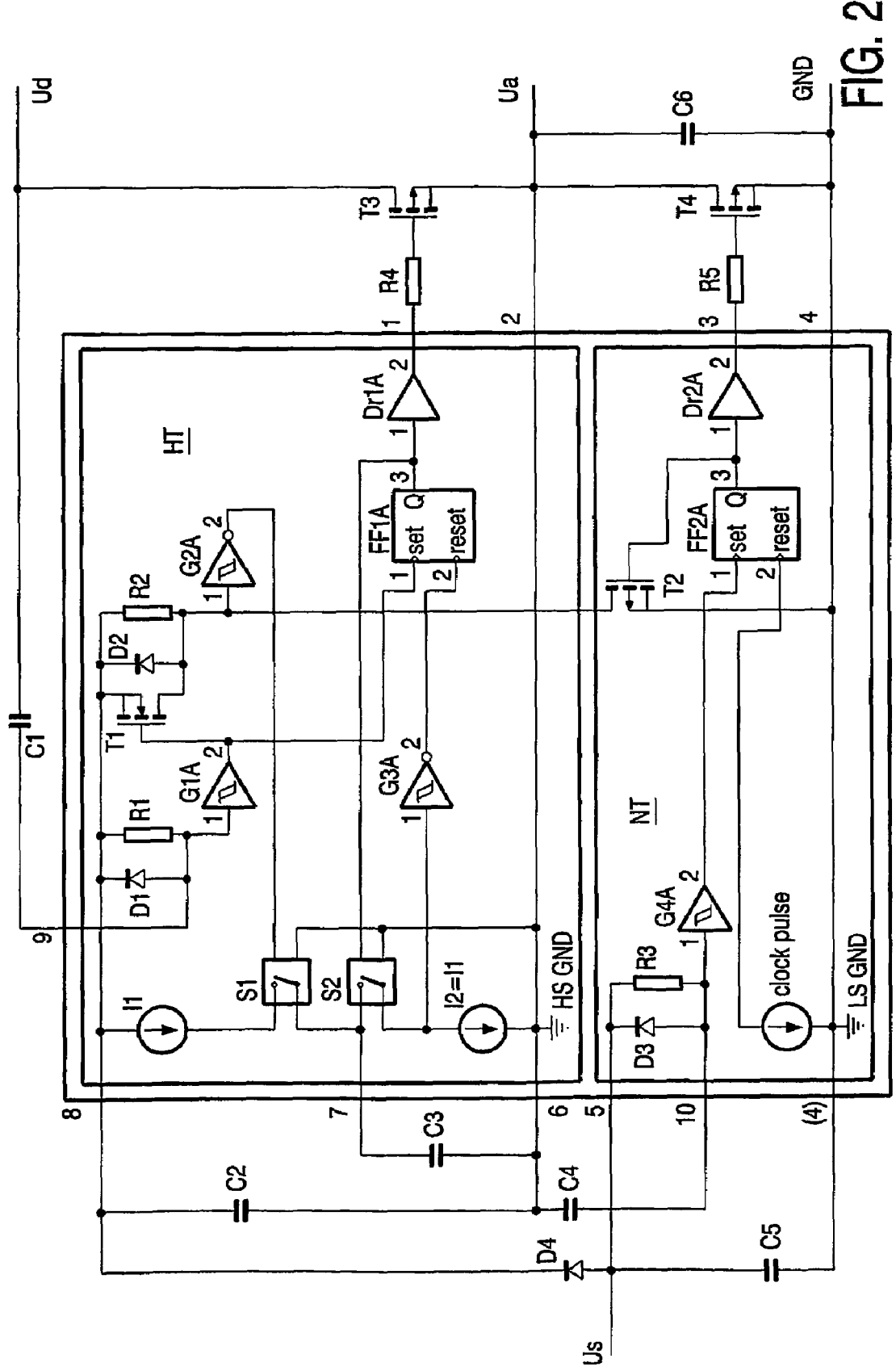
FIG. 2 shows a detailed circuit diagram of the driver circuit of FIG. 1.

FIG. 2 shows a detailed circuit diagram of this driver circuit. The low-voltage section NT includes a flip-flop FF2A—(here edge-triggered) whose input 1 is connected to the output of a voltage-decrease recognition circuit while its reset input 2 is connected to the output of the clock generator 3. The output Q of the flip-flop FF2A is connected to input 1 of a gate driver Dr2A, the output 2 of which feeds the output OLS of the IC, and is connected, via a resistor R5, to the gate electrode of the lower MOSFET T4.

The output Q of the flip-flop FF2A is also connected to the gate electrode of a transistor T2, via which the output SO of the low-voltage section NT can be short-circuited to the ground potential GND.

The voltage-decrease recognition circuit consists of a capacitor C4, which carries at one side the output potential Ua, and is connected at the other side, via the dU/dt detect input of the IC, to the input 1 of a Schmitt trigger G4A. This side of the capacitor C4 is also connected to the supply-voltage input S via a resistor R3 and a diode D3 connected in parallel therewith, the diode D3 blocking in the direction towards the supply-voltage input S.

The high-voltage section HS is equipped with a flip-flop FF1A which is also edge-triggered. Its input 1 carries, the output of a voltage-increase recognition circuit and its reset input 2 carries, the output of an integrating circuit configuration for determining the duration of the switch-on time of the MOSFET T3. Its output Q is connected, via a gate driver Dr1A, to the output OSH of the IC, the output of the gate driver Dr1A being coupled to the gate electrode of the upper MOSFET T3 via a resistor R4.

The voltage-increase recognition circuit is equipped with a Schmitt trigger G1A, the input 1 of which is connected firstly to the input HSS of the IC, via a resistor R1 and a diode D1 switched in parallel, the diode D1 blocking in the direction towards the input HSS. The input 1 of the Schmitt trigger G1A is also connected, via the output dU/dt detect of the high-voltage section HT, directly to the capacitor C1 which supplies the upper MOSFET T3 with the output voltage Ud.

The integrating circuit configuration is shown in simplified form in the present case. It comprises capacitor C3, one side of which carries at the potential of the output voltage Ua, which is the ground potential HSGND for the high-voltage section HT of the driver circuit. The other side of the capacitor C3 is connected to a first constant-current source I1 via a first switch S1, and to a second constant-current source I2 via a second switch S2. The first constant-current source I1 is supplied by the input HSS of the IC and charges the capacitor C3 with a constant current when the first switch S1 is switched on. The second constant-current source I2 is supplied by the capacitor C3 when the second switch S2 is switched on, and discharges the capacitor C3 with a constant current, the output of the second constant-current source carrying the ground potential HSGND sliding with the output voltage Ua. The switch S1 is controlled by the signal at the output 2 of a Schmitt trigger G2A. The input 1 of the Schmitt trigger G2A is firstly coupled to the transistor T2 in the low-voltage section NT, and secondly is connected to the input HSS via a resistor R2, a diode D2 connected in parallel therewith and a transistor T1, which is also connected in parallel therewith. The gate electrode of the transistor T1 is coupled to the output 2 of the Schmitt trigger G1A.

The second switch S2 is controlled via the output Q of the flip-flop FF1A.

The gate electrode of the upper MOSFET T3 is connected to the output OSH of the high-voltage section HT via the resistor R4. The output OSH is fed by the output 2 of a gate driver DR1A, the input of which carries the logic signal present at the output Q of a flip-flop FF1A. The input of the flip-flop FF1A carries, firstly the output of a voltage-increase recognition circuit, and secondly the output of a first voltage section for determining the duty cycle of the upper MOSFET T3.

Figure 3:
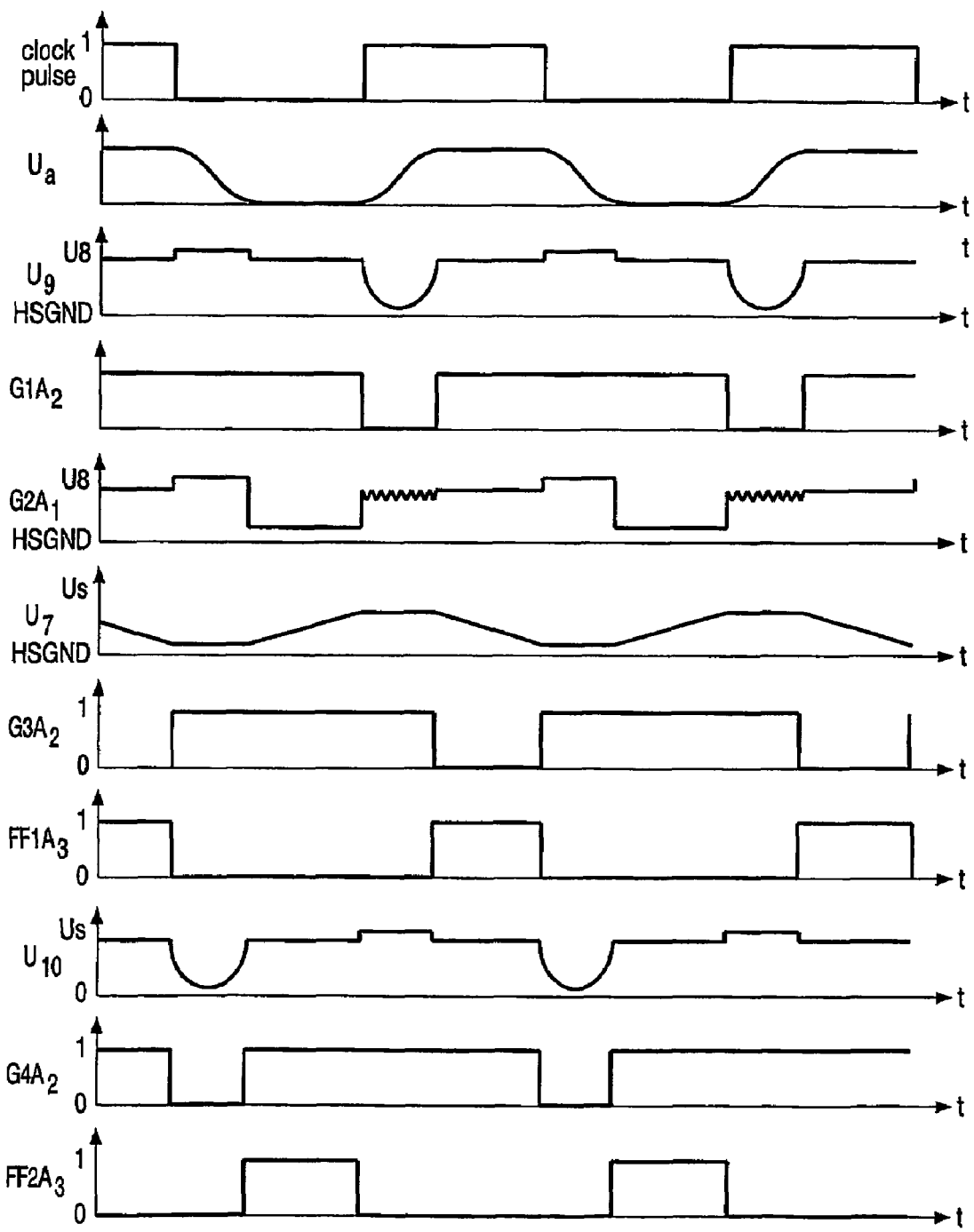
FIG. 3 shows signal characteristics for the driver circuit as shown in FIG. 1 and FIG. 2.

The following sequence of a clock cycle can be derived from the signal variations shown in FIG. 3.

At the start of the clock cycle, a clock signal at logic level 0 ("0" for short), and an output signal from the Schmitt trigger G4A at logic level 1 ("1" for short) are present at the reset input of the flip-flop FF2A, so that the output Q of the flip-flop FF2A is "1" and the transistor T4 is switched on via the gate driver Dr2A. The potential of the output Ua is equivalent to the ground potential.

The transistor T2 transmits the output signal from the flip-flop FF2A to the high-voltage section 2 at the signal input 1 of the Schmitt trigger G2A. The output 2 of G2A carries "1" and activates the current source I1 via the switch S1. The capacitor C3 is charged. The output Q of FF1A is "0" so the MOSFET T3 is switched off.

The clock pulse of the clock generator 3 changes to "1". The Flip-flop FF2A is reset to "0" so that the transistor T2 and via gate driver Dr2A, the MOSFET T4 are switched off. The output 2 of the Schmitt trigger G2A carries "0", so the switch S1 is opened. The capacitor C3 is disconnected as a result and maintains its voltage.

During the dead time in which both MOSFETs T3 and T4 are switched off, the potential Ua increases from the ground potential to the voltage Ud owing to the energy stored in the inductive elements of the resonant converter. The voltage increase is limited by the capacitor C6 and the internal capacitances of the MOSFETs T3 and T4. A small part of the current flows through the capacitors C1 and C4. The current in the capacitor C4 flows through the diode D3 and into the capacitor C5. The current in the capacitor C1 generates a voltage drop across the resistor RI, so the output 2 of the Schmitt trigger G1A changes to "0" and transistor the T1 is switched on and prevents interference at the input of G2A by the drain-source capacitance of T2.

When the voltage increase from Ua to Ud is completed, the output 2 of the Schmitt trigger GIA changes back to "1", so the flip-flop FF1A is set and the MOSFET T3 is switched on via the gate driver Dr1A. Simultaneously, the switch S2 is switched on via the output Q of the flip-flop FF1A, being "1", so the capacitor C3 is connected to the current source I2 and discharged. Simultaneously, when the switch S2 is switched on, the capacitor voltage is present at the input 1 of the Schmitt trigger G3A, the output 2 of which is "0". The capacitor C3 is discharged until the voltage present reaches the switching threshold of G3A. At this instant, the output 2 of the Schmitt trigger G3A changes to "1" and resets the flip-flop FF1A, so the switch S2 is opened and the MOSFET T3 is switched off. When the switch S2 opens, the discharging process of the capacitor C3 is completed.

This is followed by a further dead time, during which the voltage Ua at the output of the half-bridge circuit drops to ground potential. A current then flows again through the capacitors C1 and C4. The current through the capacitor C1 flows through the diode D1 into the capacitor C2. The current in the capacitor C4 generates a voltage drop across the resistor R3. As a result, the output 2 of the Schmitt trigger G4A switches to "0". The current through the drain-source capacitance of the transistor T2 flows through the diode D2 and into the capacitor C2.

The clock signal from the clock generator 3 changes to "0". However, the pulse duty factor has no effect on the switching operations in the low-voltage section NT, since the circuit uses only the positive edge of the signal via the reset input of the flip-flop FF2A for frequency adjustment.

At the end of the voltage drop from Ua to ground potential, the output 2 of the Schmitt trigger G4A changes to "1". As a result, the flip-flop FF2A is set, and the transistor T2 and via the gate driver Dr2A, the MOSFET T4 is switched on. This starts a new clock cycle.

Figure 4:
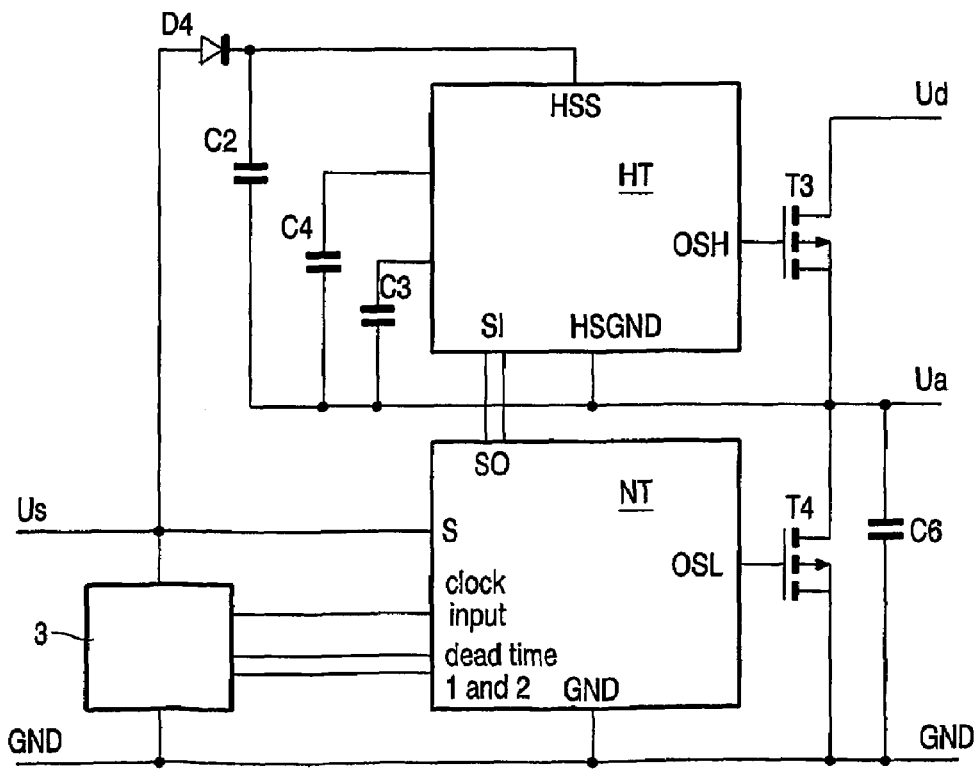
FIG. 4 shows a block diagram of a further preferred driver circuit.

FIG. 4 shows a block diagram of a different version of the driver circuit according to the invention. It differs from the version previously described in that it is not equipped with any circuit components for the recognition of a voltage increase or voltage decrease. Instead of this, the clock signal of the clock generator 3 specifies not just the signal for switching off the lower MOSFET T4, but also the dead time before the switch-on of the lower MOSFET T4. In order to determine the duration of the second dead time before the switch-on of the upper MOSFET T3, and hence the instant for the switch-on of the MOSFET T3, a second integrating circuit configuration with a capacitor C4 is provided, which is structured in exactly the same way as the first integrating circuit configuration and is charged within the duration of the switch-on phase of the lower MOSFET T4 for the desired duration of the dead-time phase before the switch-on of the MOSFET T3, and discharged within the duration of the dead-time phase before the switch-on of the upper MOSFET T3; this generally corresponds to the duration of the dead-time phase before a switch-on of the MOSFET T4. To this end, a second signal is transmitted from the low-voltage section NT to the high-voltage section HT for the duration of the dead-time phase before the switch-on of the lower MOSFET T4.

The invention claimed is:

1. A driver circuit for controlling upper and lower switching means for converting a direct voltage into a clocked output voltage for a resonant converter with a high-voltage section for controlling the upper switching means and a low-voltage section for controlling the lower switching means which switch the switching means on alternately, the switch-on phases of the switching means being separated from one another by dead-time phases, characterized in that there is provided a first circuit section which controls the duty cycle of the upper switching means as a function of the duty cycle of the lower switching means and receives control signals from the low-voltage section exclusively during the duty cycle of the lower switching means.

2. A driver circuit as claimed in claim 1, characterized in that the first circuit section is equipped with at least one first integrating circuit configuration which is charged during the duty cycle of the lower switching means and discharged during the duty cycle of the upper switching means.

3. A circuit as claimed in claim 2, characterized in that the first integrating circuit configuration is equipped with at least one integration capacitor and a charging circuit and a discharging circuit.

4. A driver circuit as claimed in claim 3, characterized in that the charging circuit and the discharging circuit are both equipped with a respective constant-current source.

5. A driver circuit as claimed in claim 2, characterized by a transistor provided in the low-voltage section which transmits a signal to the high-voltage section for the duration of the switch-on of the lower switching means.

6. A driver circuit as claimed in claim 1, characterized by a second circuit section which determines switch-on instant of the upper switching means as a function of the voltage characteristic of the output voltage.

7. A driver circuit as claimed in claim 6, characterized in that the second circuit section is equipped with a voltage-increase recognition circuit with at least one capacitor, one resistor and one comparator in particular a Schmitt trigger.

8. A driver circuit as claimed in claim 1, characterized by a second circuit section with means witch control the duration of the first dead-time phase before the switch-on of the upper switching means as a function of the duration of the second dead-time phase before the switch-on of the lower switching means or by a timer connected to the low-voltage section.

9. A driver circuit as claimed in claim 8, characterized in that the second circuit section is equipped with at least one second integrating circuit configuration which is charged for the duration $\Delta T_{tot2}$ the second dead-time phase, or for the duration of a signal form the external timer, and discharged for the duration of the first dead-time phase.

10. A driver circuit as claimed in claim 9, characterized in that the structure of the second integrating circuit configuration corresponds to the structure of the first integrating circuit configuration.

11. A driver circuit as claimed in claim 1, characterized by a voltage-decrease recognition circuit with at least one capacitor, one resistor and one comparator especially a Schmitt trigger, for determining the switch-on instant $t_{ein4}$ for the lower switching means.

12. A resonant converter with a driver circuit for controlling upper and lower switching means for converting a direct voltage into a clocked output voltage for the resonant converter with a high-voltage section for controlling the upper switching means and a low-voltage section for controlling the lower switching means which switch the switching means on alternately, the switch-on phases of the switching means being separated from one another by dead-time phases, characterized by a first circuit section, which controls the duty cycle of the upper switching means as a function of the duty-cycle of the lower switching means and receives control signals from the low-voltage section exclusively during the duty cycle of the lower switching means.

* * * * *